(12) United States Patent
Ando et al.

(10) Patent No.: US 11,756,996 B2
(45) Date of Patent: Sep. 12, 2023

(54) FORMATION OF WRAP-AROUND-CONTACT FOR GATE-ALL-AROUND NANOSHEET FET

(71) Applicant: International Business Machines Corporation, Armonk, NY (US)

(72) Inventors: Takashi Ando, Yorktown Heights, NY (US); Pouya Hashemi, Yorktown Heights, NY (US); Choonghyun Lee, Albany, NY (US); Alexander Reznicek, Albany, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 134 days.

(21) Appl. No.: 15/959,062

(22) Filed: Apr. 20, 2018

(65) Prior Publication Data
US 2019/0326395 A1    Oct. 24, 2019

(51) Int. Cl.
| H01L 29/06 | (2006.01) |
| H01L 29/423 | (2006.01) |
| H01L 29/78 | (2006.01) |
| H01L 29/66 | (2006.01) |
| H01L 21/02 | (2006.01) |

(52) U.S. Cl.
CPC .... *H01L 29/0673* (2013.01); *H01L 21/02381* (2013.01); *H01L 21/02433* (2013.01); *H01L 29/42392* (2013.01); *H01L 29/6656* (2013.01); *H01L 29/66545* (2013.01); *H01L 29/66795* (2013.01); *H01L 29/785* (2013.01); *H01L 2029/7858* (2013.01)

(58) Field of Classification Search
CPC ......... H01L 29/42392; H01L 29/66545; H01L 29/78696; H01L 29/66439; H01L 29/775; H01L 29/0673; H10B 10/12; H10B 10/125; H10B 53/30; H10B 43/20; H10B 53/40
See application file for complete search history.

(56) References Cited

U.S. PATENT DOCUMENTS

| 9,461,114 B2 | 10/2016 | Obradovic et al. |
| 9,508,829 B1 | 11/2016 | Cheng et al. |
| 9,570,609 B2 | 2/2017 | Obradovic et al. |
| 9,614,068 B2 | 4/2017 | Seo |
| 9,647,139 B2 | 5/2017 | Doris et al. |
| 9,653,289 B1 | 5/2017 | Balakrishnan et al. |
| 9,653,464 B1 | 5/2017 | Leobandung |
| 9,653,537 B1 | 5/2017 | Jagannathan et al. |
| 9,721,897 B1 | 8/2017 | Cheng et al. |
| 9,799,748 B1 | 10/2017 | Xie et al. |

(Continued)

*Primary Examiner* — Tony Tran
(74) *Attorney, Agent, or Firm* — McGinn I.P. Law Group, PLLC.

(57) ABSTRACT

A semiconductor device includes a substrate material with a semiconductor material with a predetermined crystal orientation, a gate stack having a plurality of nanosheet channel layers, each nanosheet channel layer being controlled by metal gate layers located above and below the nanosheet channel layer, each nanosheet channel layer having the same semiconductor material and crystal orientation as that of the substrate, and a source/drain region on opposite sides of the gate stack. Each source/drain region includes bridging structures respectively connected to each nanosheet channel layer.

20 Claims, 10 Drawing Sheets

(56) References Cited

U.S. PATENT DOCUMENTS

| | | |
|---|---|---|
| 9,812,321 B2 | 11/2017 | Doris et al. |
| 9,842,835 B1 | 12/2017 | Cheng et al. |
| 9,847,390 B1 * | 12/2017 | Xie .................... H01L 29/0673 |
| 10,192,867 B1 * | 1/2019 | Frougier ........... H01L 29/66545 |
| 2014/0001441 A1 | 1/2014 | Kim et al. |
| 2016/0027929 A1 | 1/2016 | Cheng et al. |
| 2016/0365411 A1 | 12/2016 | Yeh et al. |
| 2018/0301531 A1 * | 10/2018 | Xie ....................... H01L 29/775 |
| 2019/0305135 A1 * | 10/2019 | Radosavljevic .. H01L 21/02603 |

* cited by examiner

FORMATION OF WRAP-AROUND-CONTACT FOR GATE-ALL-AROUND NANOSHEET FET

BACKGROUND

The present invention relates generally to semiconductor devices and, more specifically, to a nanosheet or nanowire field-effect transistor (FET) device having source/drain contact structures with reduced access resistance, using bridging structures and a wrap-around-contact configuration.

The present invention results from a recognition that the merged epitaxial structure for the source and drain contacts of a conventional configuration of stacked nanosheet devices inherently causes an undesirable resistance particularly relative to accessing the lower nanosheet layers. The source/drain contact for these conventional nanosheet transistors can consist of, for example, silicon (Si), germanium (Ge), or silicon germanium (SiGe) epitaxy, but the present invention is not limited to Group IV semiconductors since III-V nanowires also exist.

While gate-all-around transistors have been known to have good electrostatic control to enable further scaling requirements, a reduction in external resistance is needed for high performance low power applications. Existing processes for gate-all-around transistors use the top surface or sidewalls of source/drain region/epitaxy as the contact area, which has a relatively large external resistance, also referred to herein as access resistance. Although a wrap-around-contact (WAC) can reduce contact resistance to thereby improve device performance, the conventional WAC structure is relatively complex and difficult to form in stacked device architecture.

SUMMARY

In an exemplary embodiment, the present invention provides a nanosheet or nanowire FET device and method of manufacture in which the underlying substrate using a crystal structure oriented so that bridging structures can be formed during fabrication of the source/drain contact regions. As will be explained, this crystal orientation permits faster epitaxial growth on vertical surfaces exposed in cavities etched for contact formation, so that bridging structures form laterally from the exposed sidewalls. These novel bridging structures prevent the source/drain epitaxy components from becoming a merged epitaxy component as occurs in the conventional device. A metal-based WAC is then formed around the bridging structures to provide a nanosheet or nanowire FET with reduced external (access) resistance. Thus, for purpose of the present invention, a WAC is defined as metal contact all around the source/drain epitaxy, either as the whole block or as separate sections.

The invention disclosed herein provides a method and a structure for reduced access (external) resistance in nanosheet/nanowire transistors, by making use of a wafer orientation not typically used in wafer fabrication but which orientation provides the basis for providing bridging structures in the source/drain region, which then provide opportunity to easily fabricate the WAC component. Thus, the novel epitaxial bridging structures and WAC together provide improved performance for nanosheet or nanowire FETs by reducing access (external) resistance.

Other details and embodiments of the invention will be described below, so that the contribution of the present invention to the art can be better appreciated. Nonetheless, the invention is not limited in its application to such details, phraseology, terminology, illustrations and/or arrangements set forth in the description or shown in the drawings. Rather, the invention is capable of embodiments in addition to those described and of being practiced and carried out in various ways that should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Aspects of the invention will be better understood from the following detailed description of the exemplary embodiments of the invention with reference to the drawings, in which.

DETAILED DESCRIPTION

The invention will now be described with reference to FIGS. 1-5, in which, according to common practice, the various features of the drawings are not necessarily to scale. On the contrary, the dimensions of the various features might be arbitrarily expanded or reduced for clarity.

It is noted that, although silicon is used to explain an exemplary embodiment of the present invention, the following description applies equally to germanium-based devices, since germanium and silicon have the same crystal orientations and similar characteristics for epitaxial growth, as well devices based on Group III-V nanosheets and nanowires. Additionally, although the present invention is applicable to both nanosheet and nanowire FET devices, hereinafter the description will refer to "nanosheet" generically, meaning that a nanosheet component could be reduced in dimension to form a nanowire structure.

Figure 4:
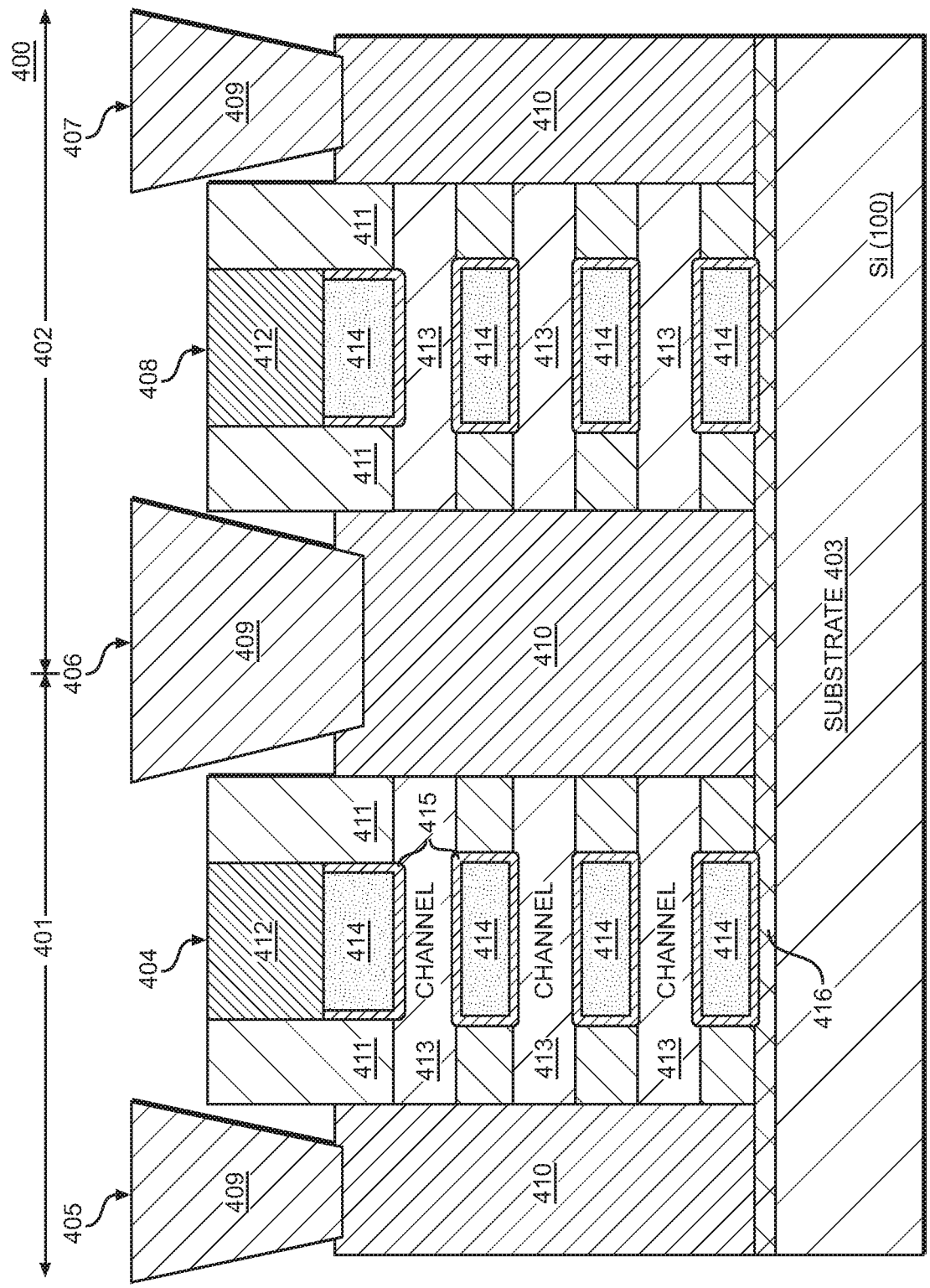
FIG. 4 exemplarily shows a cross-sectional view of a conventional nanosheet or nanowire FET device with merged epitaxy source/drain contacts.

Before explaining details of the present invention, an exemplary silicon-based conventional nanosheet FET device is described in order to better understand the significance and particularity of the present invention relative to conventional nanosheet devices. Exemplarily shown in the cross-sectional view 400 of FIG. 4 showing two conventional nanosheet FETs 401, 402 on a silicon substrate 403 having the crystal orientation (100) that is commonly used for device fabrication. Transistor 401 includes a gate structure 404 and source/drain regions 405,406, and transistor 402 includes gate structure 408 and source/drain structures 406, 407. The two FETs 401, 402 share the center source/drain region 406. Because it separates two gate structures, the width of this center source/drain region 406 demonstrates gate pitch, which is defined as the distance λ between adjacent gates in a given technology as the gate length plus the two spacers. The present invention works for small gate pitches such as 50 nm or less.

Substrate 403 is understood in the art as being the physical material upon which a semiconductor device, such as a transistor, or an integrated circuit, is applied, and can be any of, for example, Si, SiGe, Ge, Group III-V materials, or even Group II-VI materials. As is readily understood by one having ordinary skill in the art, the substrate 403 could be the wafer surface itself or it could be, for example, a layer of silicon deposited on top of a carrier wafer. As is also understood in the art, the Si (100) crystal orientation is conventionally preferred as a substrate for semiconductor fabrication.

Each source/drain region 405, 406, 407 includes a metal contact 409 connecting to its underlying source/drain epitaxy 410 that makes contact with the channels 413. Each channel 413 consists of a nanosheet or nanowire.

The source/drain epitaxy 410 has crystal structure Si (100) and is a single merged epitaxy component. Formation of the source/drain epitaxy 410 typically involves doping using, for example, doped Si or SiGe for Group IV semiconductor-based device structures, to define the transistor as being either NFET or PFET. In FIG. 4, both transistors 401, 402 are a common same type, either NFET or PFET by reason of sharing the center source/drain region 406 as a common source-drain epitaxy. PFETs can be formed, for example, by doping the source/drain epitaxy with boron doped Silicon-Germanium alloy (SiGe:B), and NFETs can be formed by doping the source/drain epitaxy with phosphorus-doped Silicon Si:P. The doping level in the doped source/drain epitaxy is typically $4\times10^{20}$ atoms per $cm^{-3}$ to $2\times10^{21}$ atoms per $cm^{-3}$.

One of ordinary skill in the art would recognize, however, that should transistor 401 and transistor 402 have separate source/drain regions rather than the shared source/drain regions 406, then they could also be different transistor types or different amounts of doping. Additionally, although the two outboard source/drain regions 405, 407 are shown as half width relative to shared source/drain 406, it should be apparent that one or both of these two source/drain regions 405, 407 could likewise have been shared with another adjacent device, in which case they would likewise have width λ as the separation of two adjacent gates. One of ordinary skill in the art would also understand that whether any one of the source/drain regions 405, 406, 407 is a source or a drain depends upon the impurity type and connections in specific circuits to different voltages. Therefore, the term "source/drain" will be used in the following description in a generic sense, meaning that a "source/drain region" could serve as either a source or a drain in the device under discussion, depending upon specific impurity type and specific connections within a specific circuit.

The gate stacks 404,408 of transistors 401, 402 each includes a plurality of channel layers 413, each channel layer 413 being either a nanosheet or nanowire depending upon its width dimension, which width dimension is not apparent from the cross sectional view in FIG. 4. In the exemplary embodiment 400 based on silicon, the channel layers 413 typically would consist of silicon (100) but channel layers are also possible using SiGe or germanium or other materials. Carrier conduction in the channel layers 413 is controlled by voltages in gate metal 414 in layers adjacent to the channel layers 413. The gate metal 414 could be, for example, titanium (Ti), tungsten (W), molybdenum (Mo), cobalt (Co), or a conductive carbon material such as carbon nanotubes, graphene, etc., or any combination thereof. Each metal gate 414 is at least partially enclosed by a gate dielectric layer 415, formed of a dielectric such as, for example, a silicon dioxide ($SiO_2$), silicon nitride (SiN), silicon oxynitride (SiON), or a high-K dielectric material such as hafnium oxide ($HfO_2$) or hafnium silicate ($HfSiO_4$), etc.

If desired, an isolation layer 416 could also be incorporated to better separate one or more components of the device from the substrate 403. This isolation layer could be a dielectric material, or a doped semiconductor layer or region. Moreover, the isolation layer 416 could selectively be applied only to portions of the device, for example, under the source/drains regions 410 only, or under the gate stack regions 404,408 only. The self-aligned contact (SAC) protective cap 412 typically comprises a nitride. Gate spacers 411 encircling the protective caps 412 are formed with an insulative dielectric material such as, for example, silicon dioxide ($SiO_2$), silicon oxynitride (SiON), or silicon nitride (SiN).

Of particular significance, relative to the present invention, is that the three source/drain regions 405, 406, 407 of the conventional nanosheet FET device 400 exemplarily shown in FIG. 4 includes epitaxy material 410 which is merged by reason of being formed by an epitaxial growth process, bottom up and laterally from the nanosheet sidewalls. The present invention recognizes that such merged epitaxy material 410 in the source/drain regions 405, 406, 407 provides a contact configuration that reduces accessibility of contribution from the bottom channel(s) of the device, especially in high performance low power applications, a concept that is referred to in this description as access resistance or external resistance.

The present invention provides a solution to this access resistance in the source/drain regions 405, 406, 407 of this conventional nanosheet device, by changing the epitaxy-based composition in the source/drain regions into a composition having epitaxy encased by metal, the metal providing a much lower resistance compared to the conventional merged epitaxy source/drain component.

Figure 1:
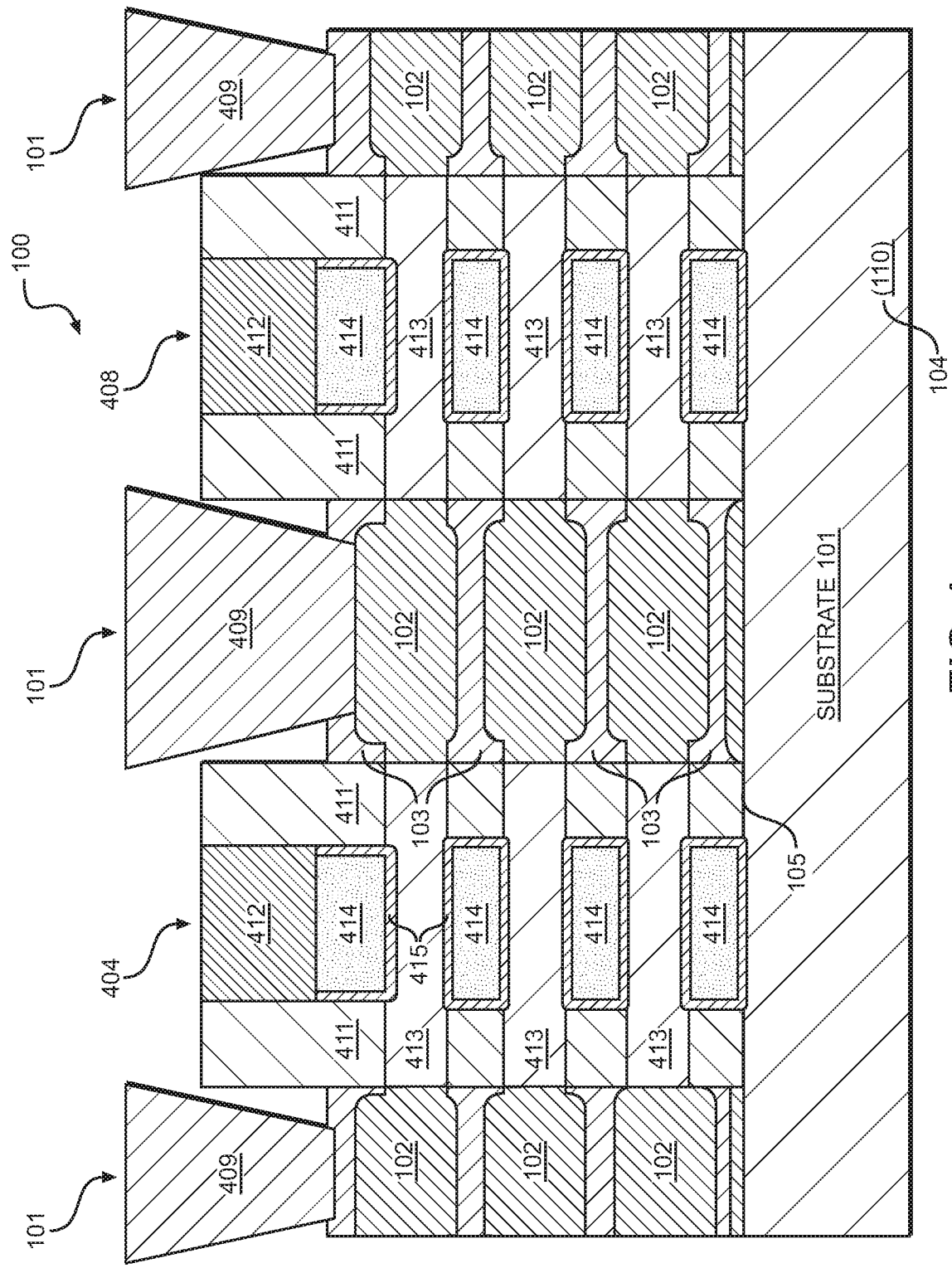
FIG. 1 exemplarily shows a cross-sectional view of a nanosheet device 100 according to an embodiment of the present invention.

In summary and as can be clearly recognized by comparing the device 400 in FIG. 4 with the exemplary embodiment 100 in FIG. 1, the present invention is similar to the conventional device 400 in the gate stack structures 404, 408 but differs substantially in the source/drain contact regions 101. Instead of merged epitaxial components 410 shown in FIG. 4, the present invention has epitaxial bridging structures 102 that are not merged together.

A second key difference is that the substrate 101 of the present invention uses crystal orientation (110) 104 rather than the (100) orientation of the conventional device shown in FIG. 4. Yet a third distinguishing feature in FIG. 1 is that the bridging structures 102 are embedded in a metal wrap-around-contact (WAC) 103, which improves access to the lower nanosheet layer(s) in the gate stack, thereby reducing access resistance in the source/drain structure 101 compared to the epitaxy-based source/drain structures 405, 406, 407 shown in FIG. 4.

As commonly defined in this art, "contact resistance" is the resistance between the epitaxy and the metal. The present invention does not change the contact resistance of the conventional nanosheet transistor since it uses epitaxy and metal that are substantially the same. Rather, the present invention reduces the whole access resistance, by providing more metal and less epitaxy to the contact component. Metal has less resistance than high doped semiconductor material, but the epitaxy material provides better contact with semiconductor channel material. As mentioned above, existing processes for gate-all-around transistors have a relatively large access (external) resistance because of their use of top surface or sidewalls of source/drain region/epitaxy as the contact area.

The gate stacks 404, 408 of the present invention still includes channels 413 whose carrier conductance is controlled by metal gate electrodes 414 enclosed by gate dielectric layers 415, and as topped with protective caps 412 encircling the gate spacers 411, similar to the conventional device 400 in FIG. 4. The channels 413 could be either silicon, SiGe, or germanium, and the substrate 101 could likewise be silicon, SiGe, or germanium, but the substrate 101 of the present invention has crystal orientation (110) rather than the (100) crystal orientation used in the exemplary conventional device of FIG. 4.

As well known in the art, the notations (100) and (110) are Miller crystal index notations that describe crystal orientations relative to the unit cells of atoms that compose the crystal. It is common to fabricate semiconductor chips using silicon and, occasionally, germanium wafers in the (100) orientation, as demonstrated by the conventional device shown in FIG. 4. However, relative to the present invention, if a device is fabricated on a wafer with substrate (110) crystal orientation, then a cavity etched into that substrate 101 will have a vertical sidewall that will expose surfaces in the (100) crystal orientation. Such exposed (100) surface would provide a surface from which a faster epitaxial growth rate than would occur from a (110) surface commonly used in conventional nanosheet (NS) structures because the (100) crystal orientation has a faster epitaxial growth rate than a (110) surface.

The present invention uses this difference in epitaxial growth rate between the (100) and (110) orientations to permit bridging structures 102 to form so as to span across the source/drain regions 101 without merging together with each other, thereby avoiding the solid merged epitaxy component 410 in the conventional device shown in FIG. 4 A layer of metal 103 that fills in the voids and encapsulates the bridging structures 102 serves as a wrap-around-contact, which provides an excellent low-resistance path for carriers transiting between the lower channels and the source/drain contacts 409. Since both silicon and germanium share the characteristic that (100) and (110) crystal orientations exhibit faster epitaxial growth on the (100) crystal orientation, the device 100 shown in FIG. 1 could be either silicon-based or germanium-based.

FIG. 2A through FIG. 2F explain an exemplary method by which the structure of FIG. 1 can be fabricated, as based on the differences from the conventional device 400 shown in FIG. 4. Thus, it is noted that the gate stacks 404, 407 of the present invention (FIG. 1) are similar to those of the conventional device 400 (FIG. 4) and it would be understood by one of ordinary skill as a routine epitaxial buildup of successive layers 202, 413 on top of substrate surface 101 in the same manner as would be implemented for the conventional device 400, with the exception that the present invention uses an underlying layer of (110) crystal orientation rather than (100) orientation. Since the underlying substrate 101 has (110) crystal orientation, each of the successive layers of the present invention could inherit the (110) crystal orientation.

Figure 2A:
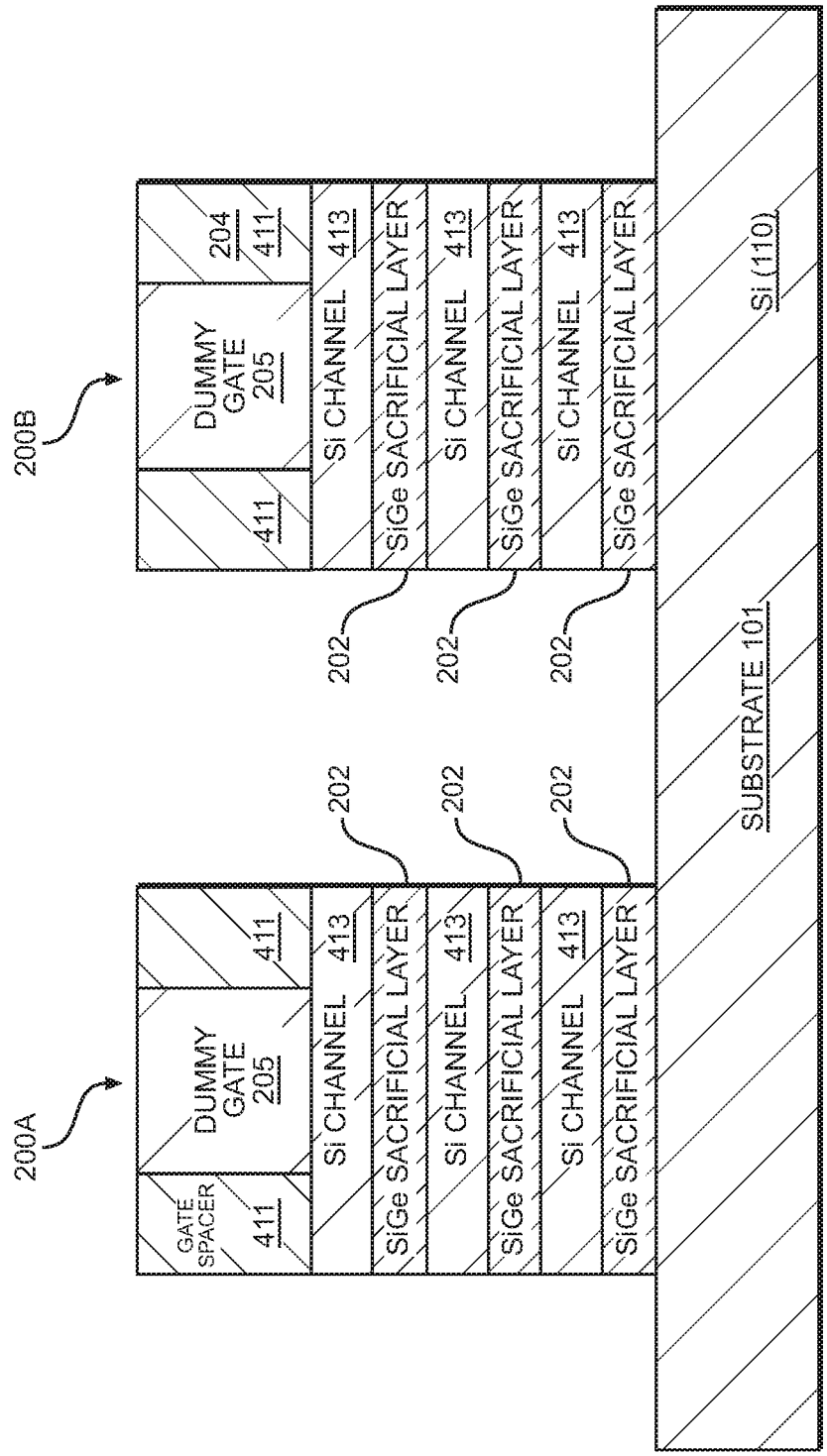
FIGS. 2A-2F exemplarily depict fabrication steps of the nanosheet device 100 according to an embodiment of the present invention.

Thus, as shown in FIG. 2A, fabrication of the present invention in view of the conventional device shown in FIG. 4 starts with the fabrication of the source/drain regions 101 as etched to provide cavities in which will be formed the source/drain structures. For clarity, FIG. 2A shows exemplarily the channel layers 413 as silicon, but subsequent figures will not specify the channel layer composition since either silicon, SiGe or germanium or other semiconductor materials could be used as the substrate 101 and the channel layer 413 material. If an isolation layer is desired between the substrate 101 and one or more components of the device, such isolation layer might be incorporated somewhere during this stage of fabrication.

FIG. 2A shows the stage in which layers of silicon germanium (SiGe) 202 and silicon (Si) 413 have previously been successively grown by epitaxy on substrate 101. In the shown example, SiGe layers 202 are sacrificial layers that will be selectively etched away and replaced in subsequent fabrication stages to form the metal gates for controlling channel carrier conductivity. The silicon layers 413 will function as channel layers for the device, as in the conventional device 400 in FIG. 4. On top of the successive SiGe/Si layers, gate spacers 411 and dummy gates 205 have been selectively deposited to serve as an etching mask for etching the Si/SiGe layers to form cavities inside of which will be formed the source/drain regions 101 shown in FIG. 1. FIG. 2A shows a cross-section view of the fin-like structures 200A, 200B that remain and that will eventually be further modified to function as the gate stacks 404, 407 shown in FIG. 1.

As well known in the art, the dummy gates 205 comprise a material that can easily and selectively be removed later in a subsequent fabrication step in which functional gates are formed. The dummy gate material can be, for example, any of polysilicon (poly-Si), amorphous silicon (a-Si), amorphous carbon (a-C), or any combination thereof. Gate spacers 411 can be formed using insulative dielectric materials such as, for example, any of silicon nitride (SiN), a silicon oxynitride (SiON), silicon carbonitride (SiCN), a silicon boronitride (SiBN), a silicon borocarbonitride (SiBCN), or combinations thereof, where the material for the dummy gate 205 can later be selectively etched relative to the gate spacer 411 when the dummy gate is replaced to form the device's final gate components. FIG. 2A shows the gate stacks 200A, 200B resultant from an etch using the gate spacers 411 and dummy gates 205 as an etching mask, using, for example, a directional etch such as reactive-ion etching (RIE) until the substrate 101 is exposed, leaving substantially vertical faces for the gate stacks 200A, 200B.

Figure 2B:
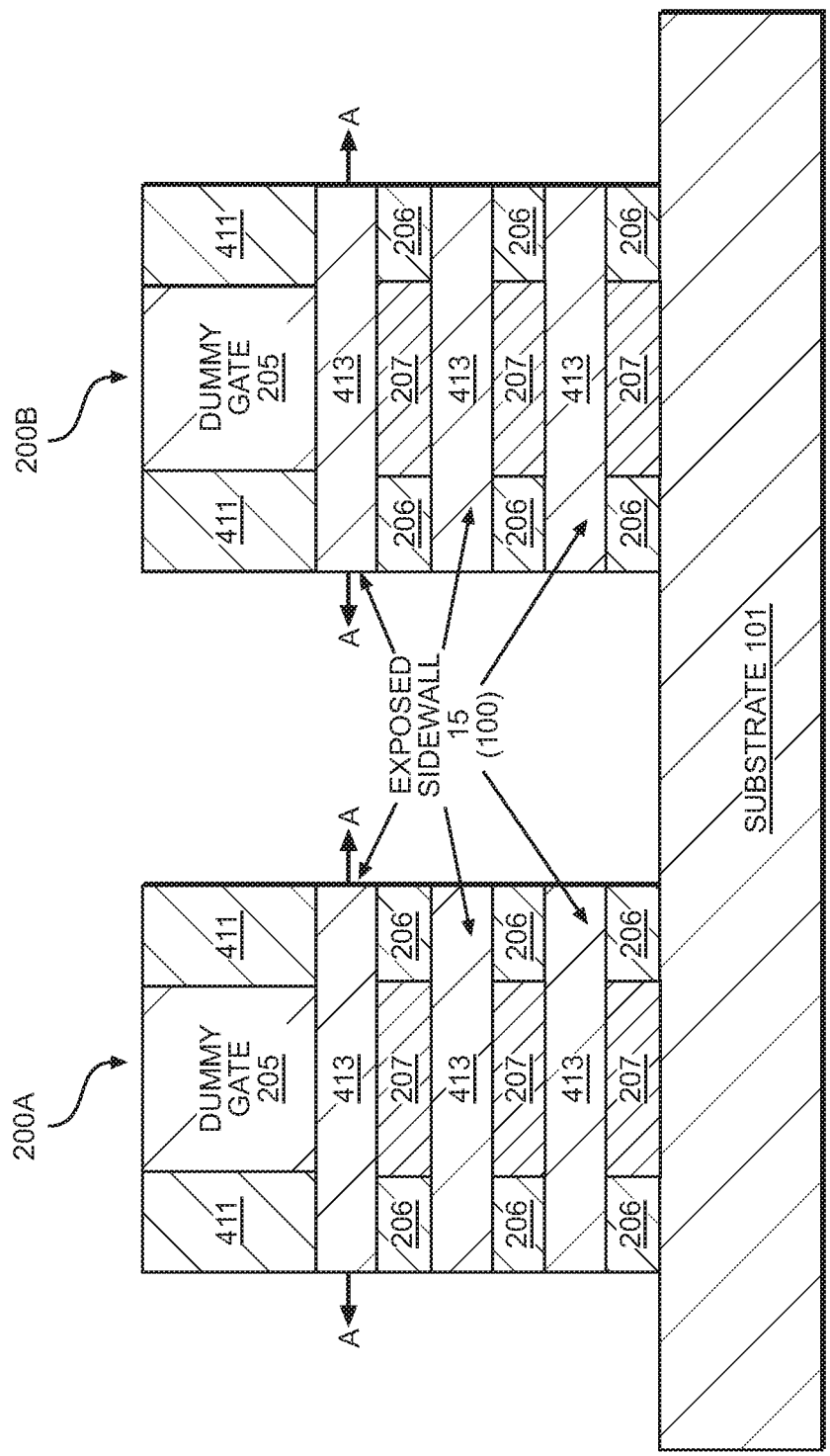

FIG. 2B shows a next stage in which an isotropic etch such as, for example, a wet chemical etch or a non-directional dry plasma etch, has selectively removed a predetermined amount of distal portions 206 of the SiGe sacrificial layers 202, as controlled by etch time. The amount of SiGe sacrificial layer removal is typically no more than 10 nanometers (nm). The etched-out indentions of the SiGe sacrificial layers are then filled in by a material deposition to form the inner spacers 206 shown in FIG. 2B. The inner spacer material can be any of, for example, silicon nitride (SiN), silicon oxide (SiO), silicon oxynitride (SiON), silicon oxycarbide (SiOC), silicon boro carbonitride (SiBCN), silicon oxycarbonitride (SiOCN), silicon carbide (SiC), a high-K metal oxide (such as, for example, hafnium oxide ($HfO_2$), hafnium silicate ($HfSiO_4$), hafnium silicon oxynitride ($Hf_wSi_xO_yN_z$), aluminum oxide ($Al_2O_3$), lanthanum oxide ($La_2O_3$), lanthanum aluminum oxide ($LaAlO_3$), zirconium oxide ($ZrO_2$), zirconium silicate ($ZrSiO_4$), zirconium silicon oxynitride ($Zr_2Si_xO_yN_z$), tantalum oxide ($TaO_2$ or $Ta_2O_5$), titanium oxide ($TiO_2$), barium strontium titanate ($BaTiO_3$—$SrTiO_3$), barium titanate ($BaTiO_3$), strontium titanate ($SrTiO_3$), yttrium oxide ($Y_2O_3$), lead scandium tantalum oxide ($Pb(Sc_xTa_{1-x})O_3$), or lead zinc niobite ($PbZn_{1/3}Nb_{2/3}O_3$), a low-K insulator (such as, for example, a fluoride-doped silicon oxide), a carbon-doped silicon oxide, a porous silicon oxide, a spin-on silicon-based polymeric material (e.g., tetraethyl orthosilicatehydrogen (TEOS)), silsesquioxane (HSQ), or methylsilsesquioxane (MSQ)), or combinations thereof.

FIG. 2B also shows that the exposed sidewalls surfaces of channel layers 413 have (100) crystal orientation, which permits rapid epitaxial growth as indicated by the arrows "A".

Figure 2C:
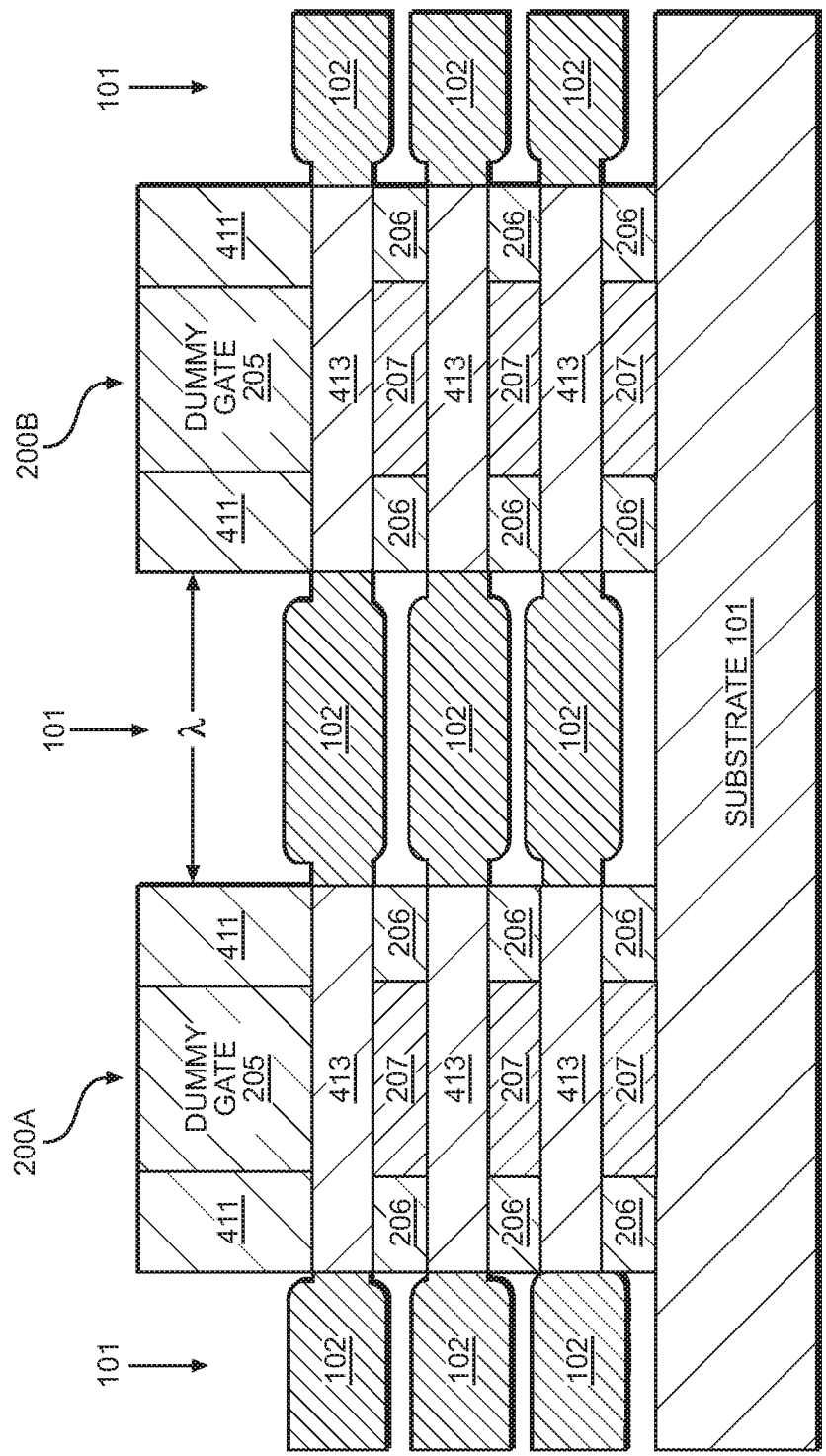

FIG. 2C shows the epitaxy growth that forms the bridging structures 102 spanning the source/drain regions 101. These bridging structures 102 result from the faster growth of the epitaxy from the exposed (100) surfaces of the channels 413 in the gate stacks 200A, 200B, compared to the relatively much slower epitaxial growth (not shown) that might also be present at the bottom surface of the source/drain regions 101. In the exemplary embodiment used to describe the present invention, the bridging structures 102 would be silicon or silicon germanium if the substrate 101 is silicon (110), but as noted, germanium-based devices would form similar bridging structures from epitaxy growth of germanium or silicon germanium. No epitaxial growth occurs from the residual SiGe sacrificial layer 207 because of the blocking effect of the inner spacers 206. It is again noted that, in contrast to the epitaxy material 410 of the related art in FIG. 4, the bridging structures 102 of the present invention are not merged together and do not contact the bottom surface of the source/drain regions 101. As in the conventional device of FIG. 4, this epitaxial growth process to form the bridging structures 102 of the source/drain regions 101 would typically involve a doping material to define the device as either PFET or NFET. As mentioned above for the conventional device, doping is achieved for a PFET by deposition of, for example, SiGe:B epitaxy, and for an NFET by deposition of, for example, Si:P epitaxy. Doping level is typically $4\times10^{20}$ atoms per $cm^{-3}$ to $2\times10^{21}$ atoms per $cm^{-3}$.

The symbol λ in FIG. 2C indicates a width of the source/drain region consistent with the targeted technology of the present invention, which is 7 nm technology or further (e.g., 5 nm technology). This width λ is within a width in which the bridging structures 102 will form stably and without collapsing until they merge together from opposite sidewalls of the source/drain regions 101, as in the center source/drain region 101, thereby completing the bridging structures 102. Alternatively, as in the two outer source/drain regions 101, the bridging structures 102 would eventually be supported by contacting with an opposing wall of the cavity etched out to form the source/drain regions. A typical value for width λ would be 10-25 nm.

Figure 2D:
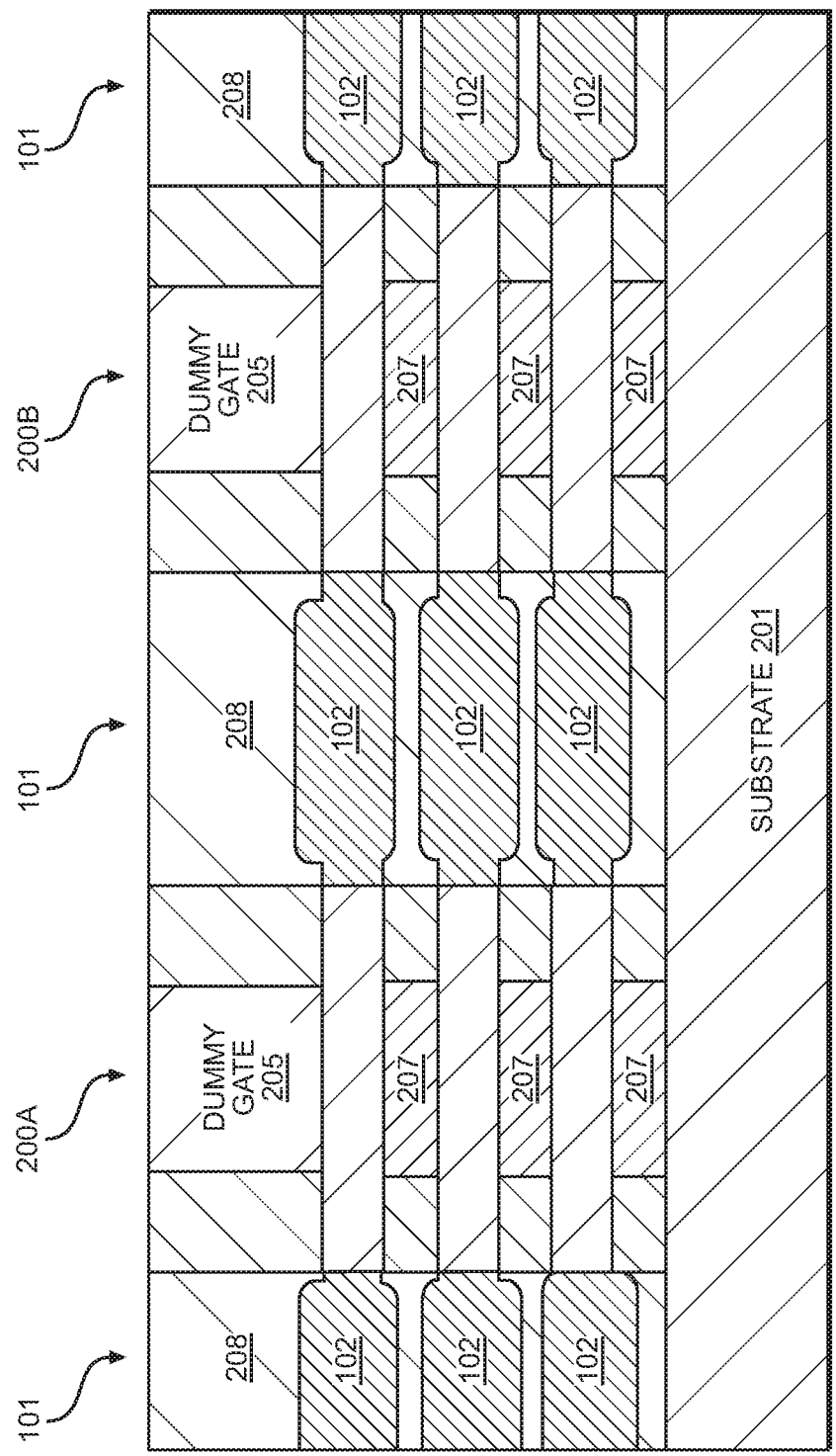
Figure 2E:
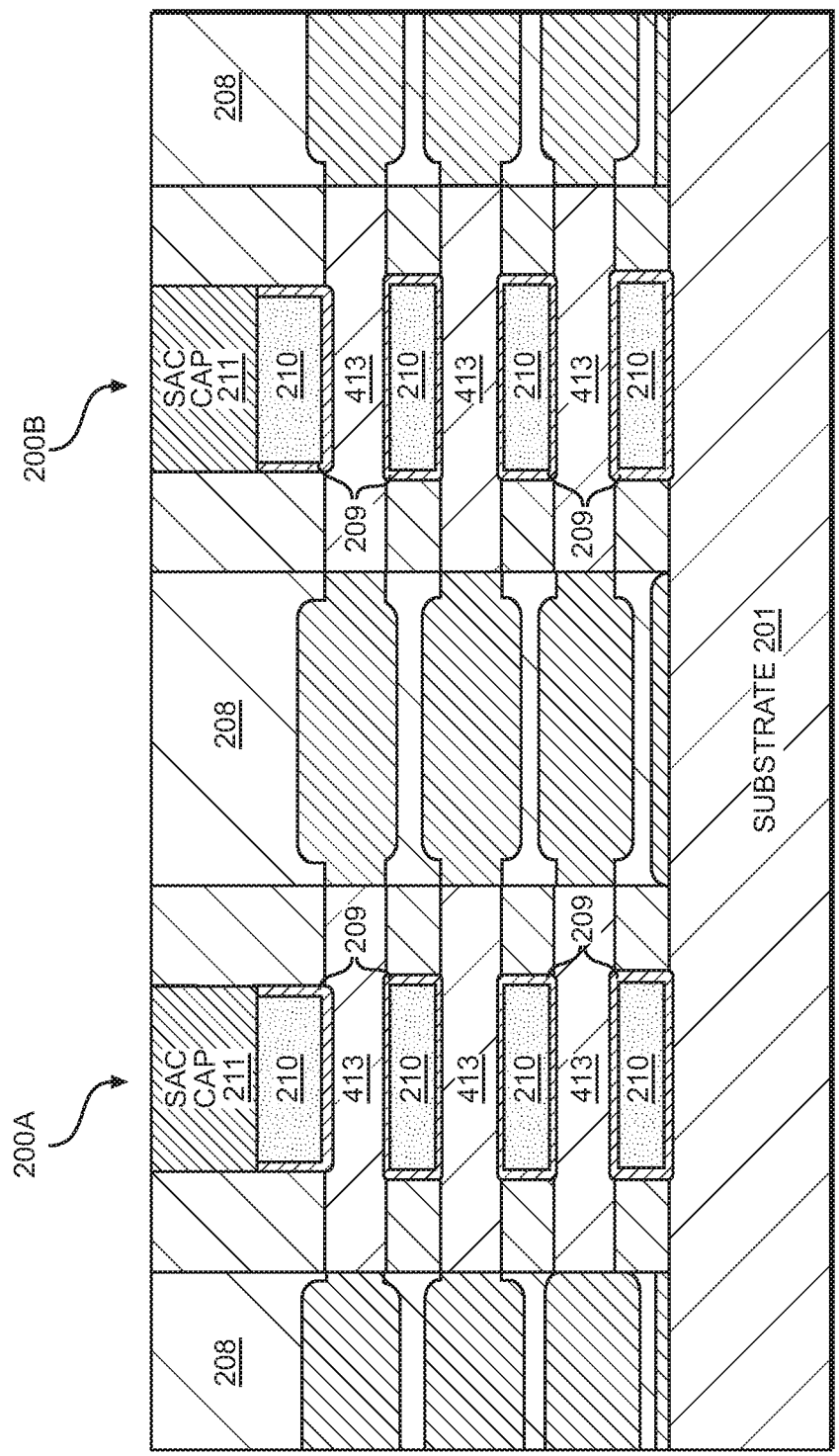

FIG. 2D shows a next stage in which an interlayer dielectric material (ILD) 208 such as $SiO_2$ is selectively deposited to surround the bridging structures 102 for protection in subsequent fabrication steps and to be able to form contact trenches into the ILD. FIG. 2E shows a selective etch of the gate stacks 200A, 200B to etch out the dummy gates 205 and residual SiGe layers 207 (FIG. 2D), using an isotrophic etch such as a wet etch selective to etch the dummy gate material 205 (FIG. 2D) and the residual SiGe material 207 (FIG. 2D), keeping in mind that the cross-sectional view of FIG. 2D does not show the ends of the devices that would permit exposure to etching for internal components such as such as the internal SiGe material 207. Once this etch is completed, there will be air gaps between the nanosheet channel layers 413, which are then filled to form gate electrodes by depositing first a gate dielectric layer 209, formed of a dielectric such as a silicon oxide (SiO), silicon nitride (SiN), silicon oxynitride (SiON), or a high-K dielectric material such as but not limiting hafnium silicate ($HfSiO_4$), etc. After formation of the gate dielectric layer 209, a conductive gate electrode fill metal 210 such as any of tungsten (W), titanium (Ti), molybdenum (Mo), cobalt (Co), a conductive carbon material such as carbon nanotubes, graphene, etc., or any combinations thereof, is deposited. Following deposition of the gate electrode fill metal 210, titanium nitride is deposited to form a protective cap 211 on the gate stacks 200A, 200B.

Figure 2F:
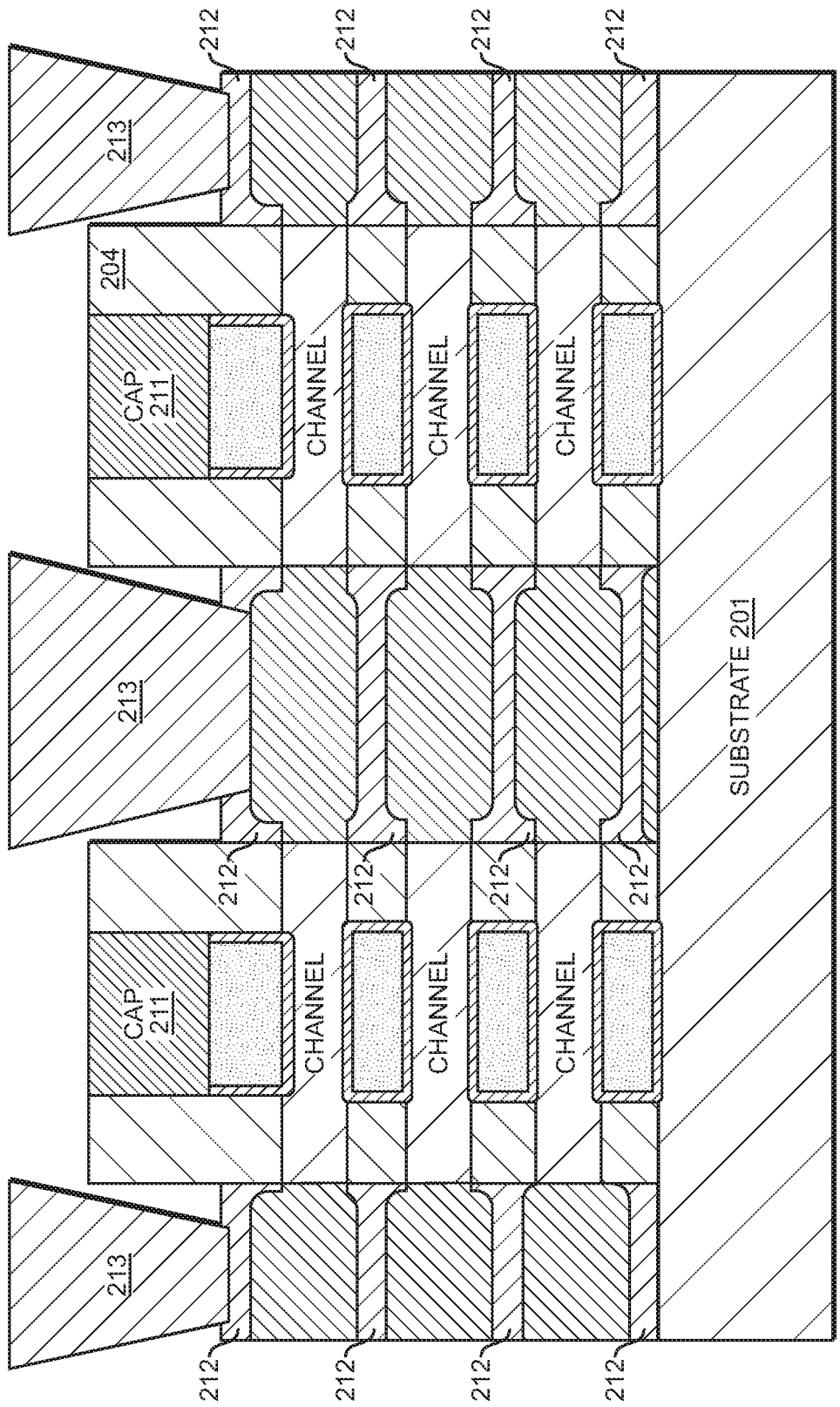

FIG. 2F shows the completion of the device by etching out the ILD material 208 and replacing it by deposition of a metal such as titanium to form the wrap-around-contacts 212 and formation of contacts 213 to the source/drain regions, using, for example, tungsten W or cobalt Co.

Figure 3:
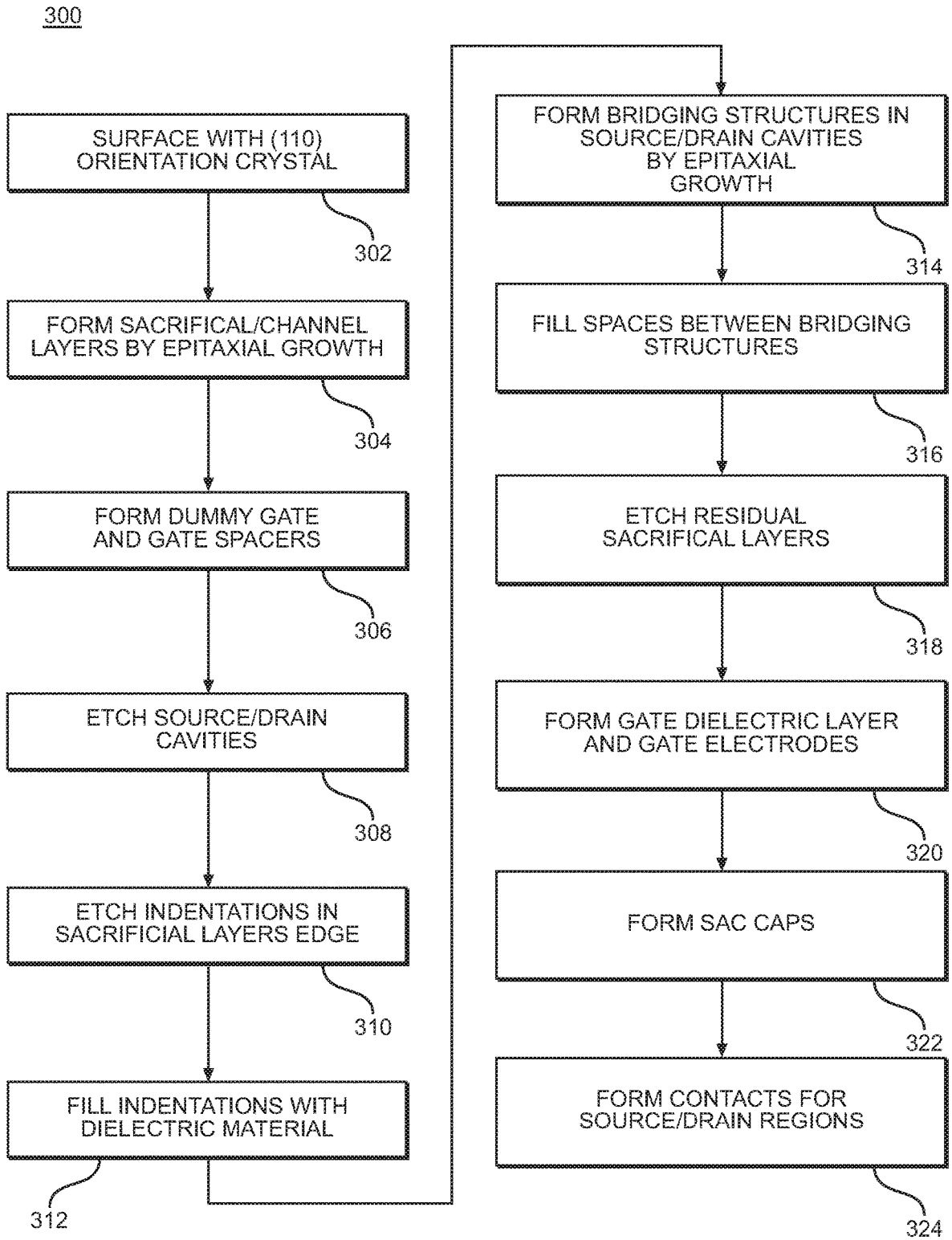
FIG. 3 exemplarily depicts in flowchart format a method of manufacturing a wrap-around-contact for gate-all-around nanosheet FETs as exemplarily described herein.

FIG. 3 shows in flowchart format 300 a summary of steps to fabricate a device in accordance with concepts of the present invention.

In step 302 a crystal surface is provided having a surface orientation that will permit exposed surfaces of a vertical etch of a built-up stack of layers to present a crystal orientation of channel layers that permits lateral epitaxial growth to form bridging structures without merging. In exemplary embodiments, either silicon (110) or germanium (110) were chosen as the underlying surface so that the vertical etch would subsequently expose a (100) surface.

In step 304, a plurality of sacrificial layers/channel layers are successively grown epitaxially on the (110) substrate. In the exemplary embodiment, the channel layers would be either silicon or germanium and the sacrificial layers would be SiGe. Although three channel/sacrificial layers were demonstrated in the exemplary embodiment, there is no limitation on the actual number of layers. Each layer in the plurality of epitaxially-grown layers would inherit the (110) crystal orientation of the underlying substrate.

In step 306, dummy gates and gate spacers are formed to serve as a mask etch so that, in step 308, cavities in the sacrificial layers/channel layers down to the substrate are etched in which source/drain structures will be constructed. The vertical sidewalls of these etched cavities will present (100) surfaces on the channel layers, for rapid epitaxial growth rate that will permit the bridge structures of the present invention to be formed.

Although not necessary to understand the present invention and not shown in FIG. 3, in an exemplary embodiment, an isolation mechanism such as a deposition of a dielectric or doped semiconductor layer could be incorporated at some fabrication stage to isolate the source/drain regions from the substrate, if desired. Various isolation mechanisms could be used but these isolation mechanisms are not considered to be part of the present invention.

In step 310, indentations are formed in the cavity sidewalls by selectively etching a predetermined portion from the edges of the sacrificial layers. In step 312, the sidewall indentations are filled with dielectric material, to form inner spacers that will isolate the sacrificial layers from the subsequent epitaxial growth used to form the bridging structures.

In step 314, an epitaxial growth process occurs. The exposed (100) surfaces of the channel layers permit formation of bridging structures that will merge from opposing sides of the cavity of the source/drain regions.

In step 316, the empty spaces between the bridging structures are filled in with interlayer dielectric (ILD) material, using deposition. In step 318, the remaining portions of the sacrificial layers are etched out to permit fabrication of gate electrode components. In step 320, a gate dielectric layer is deposited, followed by deposition of metal to form gate electrodes.

In step 322, a self-aligned contact (SAC) cap is formed over the gate stack by deposition of a nitride. In step 324, contacts are formed for the source/drain region by deposition of a metal such as aluminum, for permitting external connection to the source/drain regions of the device.

Figure 5:
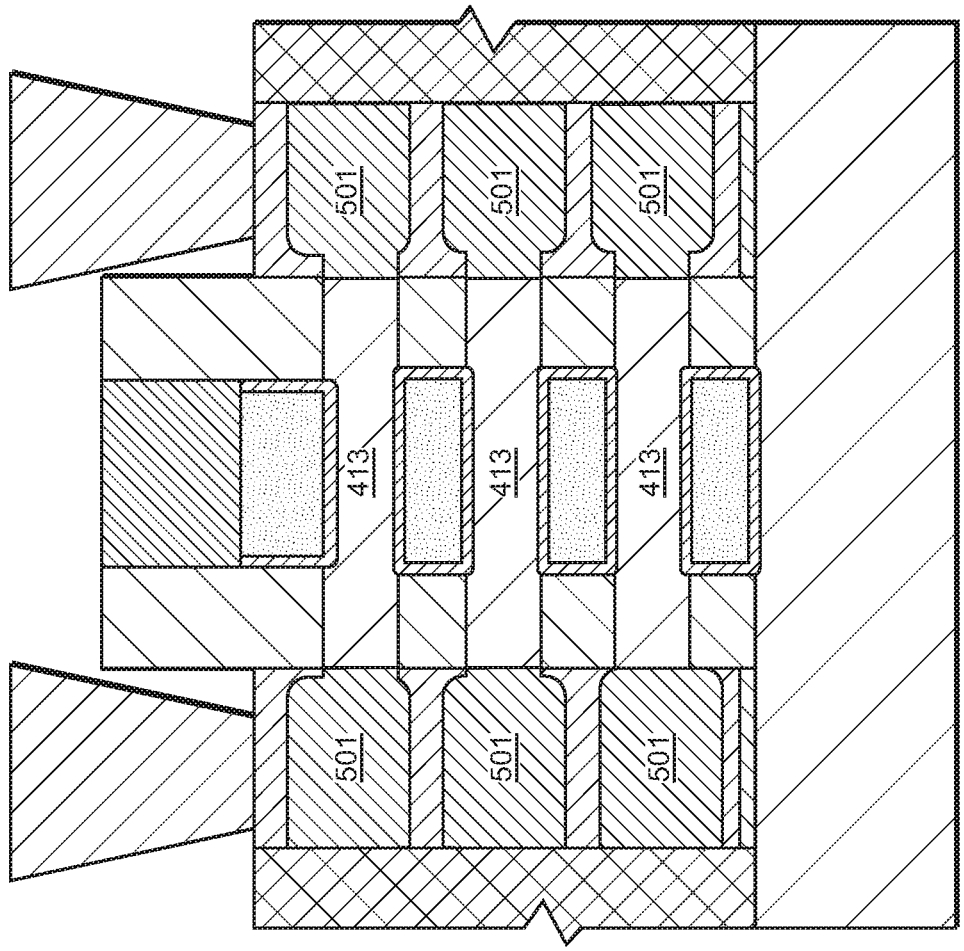
FIG. 5 exemplarily depicts a second embodiment of the present invention as a single nanosheet device.

FIG. 5 shows an example of the method and device of the present invention as implemented for a single nanosheet FET 500, for purpose of demonstrating that the trench width for forming the bridging structure depends upon whether the bridging structure is grown from only one side or is grown from two opposing sides. As previously mentioned, this dimension is predetermined to permit the bridging structures 501 to form laterally from channel nanosheets 413 of the gate stack without collapsing under its own weight before encountering a structure to support the distal end of the growing bridging structure. As shown in FIG. 5, the distal support structure for both source/drain bridging structures is the sidewall of the source/drain cavity facing the gate stack, similar to the two outboard source/drain regions 101 shown in FIG. 1.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Further, Applicants' intent is to encompass the equivalents of all claim elements, and no amendment to any claim of the present application should be construed as a disclaimer of any interest in or right to an equivalent of any element or feature of the amended claim.

What is claimed is:

1. A semiconductor device, comprising:
    a substrate comprising a semiconductor material with a predetermined crystal orientation;
    a gate stack comprising a plurality of nanosheet channel layers, each nanosheet channel layer being controlled by metal gate electrodes located above and below the nanosheet channel layer, each nanosheet channel layer comprising the same semiconductor material and crystal orientation as that of the substrate;
    a source/drain region including a source/drain epitaxy on each of opposite sides of the gate stack, each source/drain region comprising a plurality of separated bridging structures respectively connected to each nanosheet channel layer;
    a metal wrap-around-contact separately located in each source/drain region, the metal wrap-around-contact located in spaces between the bridging structures and encapsulating the bridging structures,
    wherein the bridging structures are entirely embedded in the metal wrap-around-contact, and the bridging structures are each separated from each other,
    wherein the source/drain epitaxy includes a crystal structure Si (100) that is a single merged epitaxy component.

2. The semiconductor device of claim 1, wherein the substrate comprises silicon with a (110) crystal orientation, wherein the metal wrap-around-contact is distinct from the bridging structure in the source/drain region, the metal wrap-around-contact filling spaces between the bridging structures that are separated, and the metal wrap-around-contact encapsulate the bridging structures, and
    wherein the metal wrap-around-contact is separated from the bridging structure in the source/drain region.

3. The semiconductor device of claim 1, wherein the bridging structures do not contact each other,
    wherein the bridging structures are void of being merged together.

4. The semiconductor device of claim 1, wherein each nanosheet channel layer comprises a nanowire channel layer so that the semiconductor device comprises a nanowire transistor, and
    wherein the substrate comprises silicon with a (110) crystal orientation.

5. The semiconductor device of claim 1, wherein the bridging structures include a boron-doped Silicon-Germanium alloy (SiGe:B) to provide a p-channel field effect transistor (PFET), and,
    wherein the source/drain region includes the source/drain epitaxy including a crystal structure Si (100) and is a single merged epitaxy component,
    wherein the bridging structures are void of being merged together.

6. The semiconductor device of claim 1, wherein the bridging structures include a phosphorus-doped Silicon (Si: P) to provide an n-channel field effect transistor (NFET), and
    wherein the metal wrap-around-contact is set apart from the bridging structure in the source/drain region, the metal wrap-around-contact filling spaces between the bridging structures that are separated, and the metal wrap-around-contact encapsulate the bridging structures.

7. The semiconductor device of claim 1, wherein each bridging structure is connected to its respective nanosheet layer at a proximal end and to a dielectric material at a distal end,
    wherein the a source/drain region comprises a semiconductor layer distinct from the metal wrap-around-contact,
    wherein the bridging structures span across the source/drain region, and
    wherein the bridging structures include epitaxial bridging structures that are not merged together.

8. The semiconductor device of claim 1, as comprising a first semiconductor device of a pair of adjacent semiconductor devices, wherein one of the source/drain regions of the first semiconductor device is shared as a common source/drain region of a second semiconductor device of the pair of adjacent semiconductor devices, and wherein each bridging structure in the shared source/drain region is connected to its respective nanosheet layers in each of the first and second semiconductor devices,
    wherein the bridging structures are each separated from each other, and
    wherein the metal wrap-around-contact is set apart from the bridging structure in the source/drain region.

9. The semiconductor device of claim 1, wherein a width dimension of the source/drain region is 10-20 nanometers,
    wherein the bridging structures do not contact each other, and
    wherein the source/drain region includes the source/drain epitaxy including a crystal structure Si (100) and is a single merged epitaxy component.

10. The semiconductor device of claim 1, further comprising a metal contact positioned on the metal wrap-around-contact, the metal wrap-around-contact comprising a conductive path between the metal contact and the plurality of nanosheet channel layers,
wherein the bridging structures do not contact each other,
wherein the bridging structures are void of being merged together.

11. The semiconductor device of claim 1, wherein the source/drain region includes a source/drain epitaxy and is a merged epitaxy component.

12. The semiconductor device of claim 1, wherein the substrate comprises silicon with a (110) crystal orientation,
wherein the metal wrap-around-contact is distinct from the bridging structure in the source/drain region, the metal wrap-around-contact filling spaces between the bridging structures that are separated, and the metal wrap-around-contact encapsulate the bridging structures,
wherein the source/drain region includes the source/drain epitaxy including the crystal structure Si (100) and is a single merged epitaxy component, and
wherein the bridging structures are each separated from each other and are void of being merged together.

13. A semiconductor chip, comprising at least one semiconductor device that comprises:
at least one gate stack comprising a plurality of channel layers, each channel layer being controlled by metal gate electrodes located above and below the nanosheet channel layer;
a source/drain region on each of opposite sides of each gate stack, each source/drain region comprising a plurality of separated bridging structures respectively connected to each channel layer, and each bridging structure having a same semiconductor material and crystal orientation as that of the channel layer;
a metal wrap-around-contact separately positioned in the source/drain region, the metal wrap-around-contact filling spaces between the bridging structures and encapsulating the bridging structures,
wherein the bridging structures are embedded in the metal wrap-around-contact,
wherein the bridging structures are each separated from each other, and
wherein the source/drain epitaxy includes a crystal structure Si (100).

14. The semiconductor chip of claim 13, wherein the bridging structures do not contact each other, and further comprising:
a metal contact positioned on the metal wrap-around-contact, the metal wrap-around-contact comprising a conductive path between the metal contact and the plurality of nanosheet channel layers; and
an interlayer dielectric (ILD) material being selectively deposited to surround the bridging structures,
wherein the bridging structures are entirely embedded in the metal wrap-around-contact.

15. The semiconductor chip of claim 13, wherein each channel layer comprises one of a nanowire channel layer and a nanosheet channel,
wherein the bridging structures are filled in with an interlayer dielectric (ILD) material,
wherein the bridging structures do not contact each other,
wherein the source/drain region includes the source/drain epitaxy including the crystal structure Si (100) and is a single merged epitaxy component, and wherein the bridging structures are void of being merged together.

16. The semiconductor chip of claim 13, wherein the bridging structures include a boron-doped Silicon-Germanium alloy (SiGe:B) to provide a p-channel field effect transistor (pFET).

17. The semiconductor chip of claim 13, wherein the bridging structures include a phosphorus-doped Silicon (Si:P) to provide an n-channel field effect. transistor (nFET),
wherein the bridging structures are each separated from each other, and
wherein the metal wrap-around-contact is distinct from the bridging structure in the source/drain region, the metal wrap-around-contact filling spaces between the bridging structures that are separated, and the metal wrap-around-contact encapsulate the bridging structures.

18. A semiconductor device, comprising:
a substrate comprising a semiconductor material with a predetermined crystal orientation;
a gate stack comprising a plurality of nanosheet channel layers, each nanosheet channel layer being controlled by metal gate electrodes located above and below the nanosheet channel layer;
a source/drain region on each of opposite sides of the gate stack, each source/drain region comprising bridging structures respectively connected to each nanosheet channel layer; and
a metal wrap-around-contact in the source/drain region, the metal wrap-around-contact filling spaces between the bridging structures and encapsulating the bridging structures,
wherein the bridging structures are each separated from each other, and
wherein the source/drain epitaxy includes a crystal structure Si (100).

19. The semiconductor device of claim 18, further comprising:
a metal contact positioned on the metal wrap-around-contact, the metal wrap-around-contact comprising a conductive path between the metal contact and the plurality of nanosheet channel layers,
wherein the bridging structure is not merged together,
wherein the bridging structures do not contact each other,
wherein the source/drain region includes the source/drain epitaxy including the crystal structure Si (100) and is a single merged epitaxy component,
wherein the bridging structures are void of being merged together, and
wherein the source/drain region includes the source/drain epitaxy the crystal structure Si (100) and is a single merged epitoxy component.

20. The semiconductor device of claim 18, wherein the bridging structures do not contact each other and are not merged,
wherein the source/drain region includes a source/drain epitaxy and is a merged epitaxy component,
wherein the source/drain region on each of opposite sides of each gate stack, each source/drain region comprising a plurality of the bridging structures that are separated from each other respectively connected to each channel layer, and each bridging structure having a same semiconductor material and crystal orientation as that of the channel layer,
wherein the metal wrap-around-contact separately positioned in the source/drain region, the metal wrap-around-contact filling spaces between the bridging structures and encapsulating the bridging structures, wherein the source/drain region includes the source/drain epitaxy including the crystal structure Si (100) and is a single merged epitaxy component, and wherein the metal wrap-around-contact is separated from the bridging structure in the source/drain region.

* * * * *